(12) United States Patent
Huang et al.

(10) Patent No.: US 7,400,188 B2
(45) Date of Patent: Jul. 15, 2008

(54) VOLTAGE PROVIDING CIRCUIT

(75) Inventors: Yong-Zhao Huang, Shenzhen (CN);
Yun Li, Shenzhen (CN)

(73) Assignees: Hong Fu Jin Precision Industry (Shenzhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 67 days.

(21) Appl. No.: 11/365,640

(22) Filed: Feb. 28, 2006

(65) Prior Publication Data
US 2006/0197582 A1    Sep. 7, 2006

(30) Foreign Application Priority Data
Mar. 5, 2005    (CN)    ..................... 2005 1 0033485

(51) Int. Cl.
*G05F 1/10*    (2006.01)
*H03L 7/00*    (2006.01)

(52) U.S. Cl. .................. 327/543; 327/542; 327/143; 327/198; 361/18; 361/20

(58) Field of Classification Search .............. 327/542, 327/543, 143, 198; 361/18, 20
See application file for complete search history.

(56) References Cited

U.S. PATENT DOCUMENTS

| | | | |
|---|---|---|---|
| 6,404,174 B1 * | 6/2002 | Boudreaux et al. | 323/273 |
| 6,958,583 B1 | 10/2005 | An | |
| 2005/0122644 A1 * | 6/2005 | Ma et al. | 361/56 |

* cited by examiner

*Primary Examiner*—Quan Tra
*Assistant Examiner*—Colleen O'Toole
(74) *Attorney, Agent, or Firm*—Morris Manning Martin LLP; Tim Tingkang Xia, Esq.

(57) ABSTRACT

A voltage providing circuit includes a protective circuit and a power supply circuit. The protective circuit includes a first transistor. A first control signal is input to a collector of the first transistor, a second control signal is input to a base of the first transistor, an emitter of the first transistor is grounded. The collector of the first transistor is connected to the power supply circuit. The second control signal and the first control signal jointly control the power supply circuit to be turned on or turned off. When the second control signal is at a low level, the first transistor is turned off and the power supply circuit is turned off. When the second control signal is at a high level, the first transistor is turned on and the power supply circuit is turned on. Thus, the providing circuit can prevent the electronic component from being damaged when a computer is restarted.

5 Claims, 2 Drawing Sheets

VOLTAGE PROVIDING CIRCUIT

BACKGROUND OF THE INVENTION

1. Field of the Invention

The present invention relates to a voltage providing circuit for an electronic component of a computer, and particularly to a voltage providing circuit which can prevent an electronic component from being damaged when the computer is restarted because of a current failure.

2. General Background

Electronic components of a computer such as a memory, a central processing unit (CPU), a south bridge chip, and a north bridge chip need power to work. The power is provided by a motherboard of the computer.

Referring to FIG. 2, a conventional voltage providing circuit for a memory of a computer includes three metal-oxide-semiconductor field-effect transistors (MOSFETS) 10, 20, 30, a transistor Q10, and a controlled rectifier Q20. The MOSFET 10 is a P-channel-deplete MOSFET. The MOSFET 20 and the MOSFET 30 are N-channel-deplete MOSFETS. A control signal S10 is input to a base of the transistor Q10, a voltage V10 is input to a collector of the transistor Q10, and an emitter of the transistor Q11 is grounded. The voltage V10 is input to a source of the MOSFET 10, a gate of the MOSFET 10 is connected to the collector of the transistor Q10. A gate of the MOSFET 20 is connected to the collector of the transistor Q10, a drain of the MOSFET 20 is coupled to a drain of the MOSFET 10, and a source of the MOSFET 20 is grounded. A voltage V20 is input to a drain of the MOSFET 30, a gate of the MOSFET 30 is connected to the drain of the MOSFET 20, and a source of the MOSFET 30 is connected to a terminal Vout' and is grounded via resistors R10 and R20. A cathode of the controlled rectifier Q20 is coupled to the drain of the MOSFET 10, a reference of the controlled rectifier Q20 is connected to a node between the resistor R10 and the resistor R20, and an anode of the controlled rectifier Q20 is grounded.

When the computer works normally, the control signal S10 is at a high level. So the transistor Q10 is turned on, and a voltage of the collector of the transistor Q10 is a low level voltage. Thus, the low level voltage is input to the gates of the MOSFET 10 and the MOSFET 20. So the MOSFET 10 is turned on and the MOSFET 20 is turned off. At the same time, the MOSFET 30 and the controlled rectifier Q20 are turned on. A voltage is output from the terminal Vout' and is input to the memory. The voltage from the terminal Vout' is: Vout'=Vref (voltage of the reference of the controlled rectifier)×[1+(R20/R10)]. In addition, a signal 'power-ok' (PWR-OK) is input to the memory. The memory will start to work when the PWR-OK signal is at a high level. If the computer is turned off improperly, the PWR-OK signal becomes low level immediately, but the control signal S10 becomes low level slowly. If the computer is restarted immediately, the PWR-OK signal is at a low level but the control signal S10 is still at a high level. So the voltage from the terminal Vout' is input to the memory, but the memory has not started to work yet. Thus, the memory may be destroyed by the voltage from the terminal Vout'.

What is needed is a voltage providing circuit which can prevent an electronic component from being damaged when the computer is restarted.

SUMMARY

A voltage providing circuit for an electronic component in accordance with a preferred embodiment includes a protective circuit and a power supply circuit. The protective circuit includes a first transistor. A first control signal is input to a collector of the first transistor, a second control signal is input to a base of the first transistor, an emitter of the first transistor is grounded. The collector of the first transistor is connected to the power supply circuit. The second control signal and the first control signal jointly control the power supply circuit to be turned on or turned off. When the second control signal is at a low level, the first transistor is turned off and the power supply circuit is turned off. When the second control signal is at a high level, the first transistor is turned on and the power supply circuit is turned on. Thus, the providing circuit can prevent the electronic component from being damaged when a computer is restarted.

Other objects, advantages and novel features will become more apparent from the following detailed description when taken in conjunction with the accompanying drawings, in which:

DETAILED DESCRIPTION OF THE EMBODIMENTS

Figure 1:
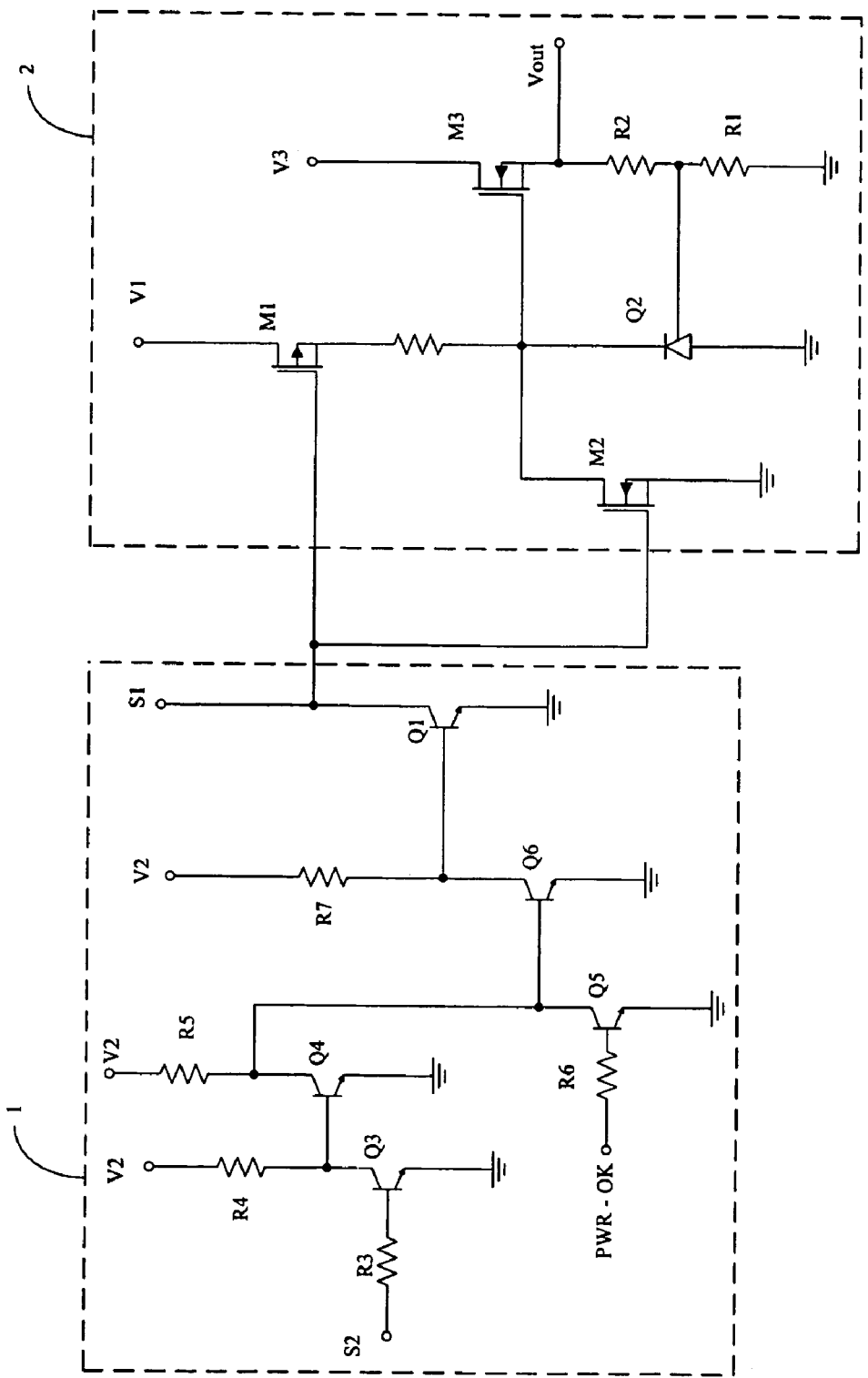
FIG. 1 is a circuit block diagram of a voltage providing circuit for an electronic component, in accordance with a preferred embodiment of the present invention.
Figure 2:
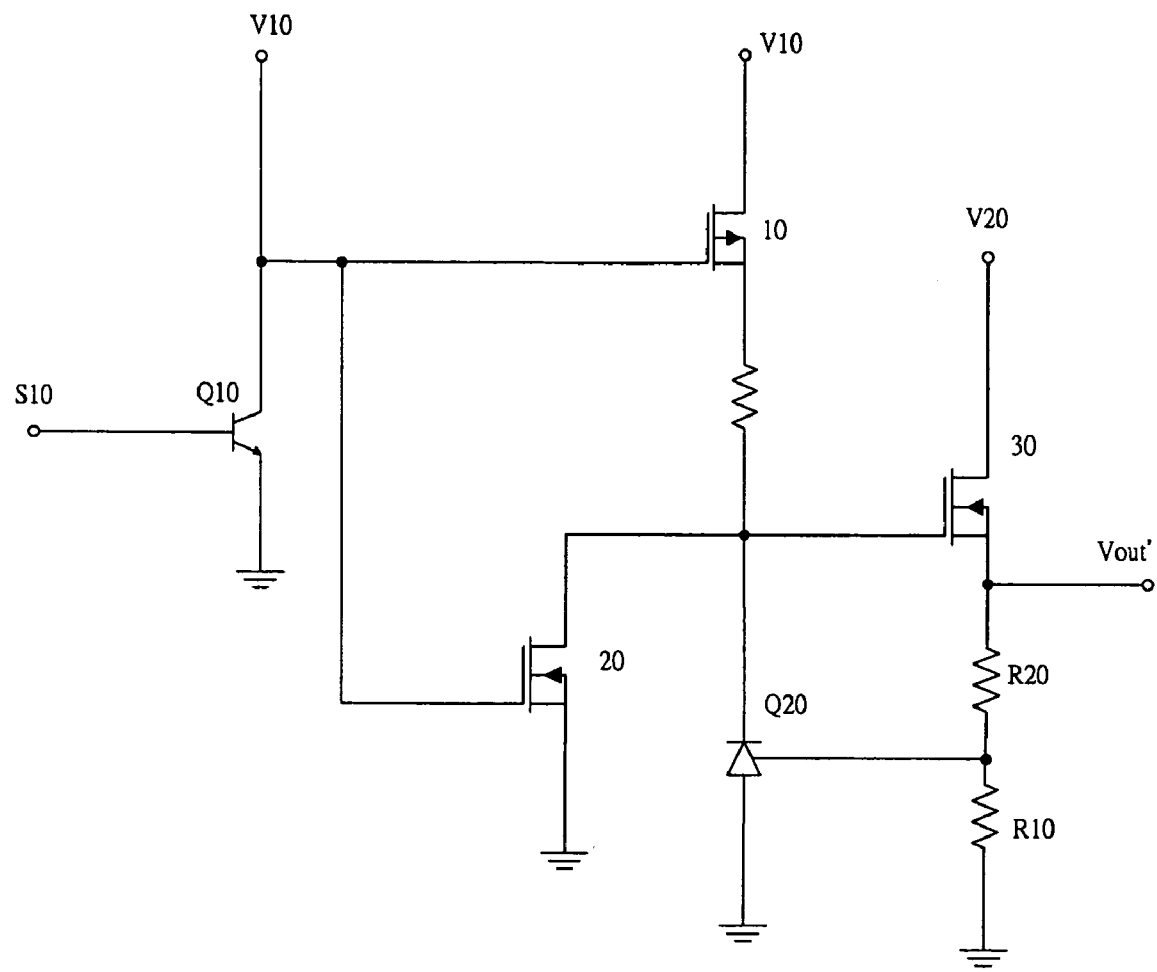
FIG. 2 is a circuit diagram of a conventional voltage providing circuit for an electronic component.

Referring to FIG. 1, a voltage providing circuit for an electronic component such as a memory of a preferred embodiment of the present invention includes a protective circuit 1 and a power supply circuit 2. The power supply circuit includes MOSFETS M1, M2, M3, and a controlled rectifier Q2. The protective circuit 1 includes transistors Q1, Q3, Q4, Q5, and Q6 used as controllable switches. The transistors Q1, Q3, Q4, Q5, and Q6 are NPN transistors. The MOSFET M1 is a P-channel-deplete MOSFET. The MOSFET M2 and the MOSFET M3 are N-channel-deplete MOSFETS. A control signal S2 is input to a base of the transistor Q3 via a resistor R3, a voltage V2 is input to a collector of the transistor Q3 via a resistor R4, and an emitter of the transistor Q3 is grounded. A base of the transistor Q4 is connected to the collector of the transistor Q3, the voltage V2 is input to a collector of the transistor Q4 via a resistor R5, and an emitter of the transistor Q4 is grounded. A control signal 'PWR-OK' is input to a base of the transistor Q5 via a resistor R6, a collector of the transistor Q5 is connected to the collector of the transistor Q4, and an emitter of the transistor Q5 is grounded. A base of the transistor Q6 is connected to the collector of the transistor Q5, the voltage V2 is input to a collector of the transistor Q6 via a resistor R7, and an emitter of the transistor Q6 is grounded. A base of the transistor Q1 is connected to the collector of the transistor Q6, a control signal S1 is input to a collector of the transistor Q1, and an emitter of the transistor Q1 is grounded. The control signal S1 is input to gates of the MOSFET M1 and the MOSFET M2. A voltage V1 is input to a source of the MOSFET M1, and a drain of the MOSFET M1 is coupled to a drain of the MOSFET M2. A source of the MOSFET M2 is grounded. A voltage V3 is input to a drain of the MOSFET M3, a gate of the MOSFET M3 is connected to the drain of the MOSFET M2, and a source of the MOSFET M3 is connected to a terminal Vout and is grounded via resistors R1, R2. A value of the voltage V3 is equal to that of the voltage V2. A cathode of the controlled rectifier Q2 is coupled to the drain of the MOSFET M1, a reference of the controlled rectifier Q2 is connected to a node between the resistor R1 and the resistor R2, and an anode of the controlled rectifier Q2 is grounded.

When the computer works normally, the control signals S1, S2, and PWR-OK are at a high level. The transistor Q3 is turned on, and the transistor Q4 is turned off. The control PWR-OK signal is at a high level, so the transistor Q5 is turned on. Thus, a low level voltage is input to the base of the transistor Q6, so the transistor Q6 is turned off. Thus, the voltage V2 is input to the base of the transistor Q1, so the transistor Q1 is turned on. A low level voltage is input to the gates of the MOSFET M1 and the MOSFET M2. So, the MOSFET M1, the MOSFET M3, and the controlled rectifier Q2 are turned on, and the MOSFET M2 is turned off. Thus, a voltage is output from the terminal Vout and is input to the memory. When the computer is turned off improperly, the control PWR-OK signal becomes low level immediately, and the control signal S1 becomes low level slowly. When the computer is quickly restarted, the control signal PWR-OK is at a low level and the control signal S1 is still at a high level. The transistor Q5 is turned off, the transistor Q6 is turned on, and the transistor Q1 is turned off. So the control signal S1 is input to the gates of the MOSFET M1 and the MOSFET M2. Thus, the MOSFET M1, the MOSFET M3, and the controlled rectifier Q2 are turned off, and the MOSFET M2 is turned on. The terminal Vout will not output a voltage to the memory until the control signal PWR-OK is at a high level. So the providing circuit can prevent an electronic component from being damaged when the computer is restarted.

Additionally, the transistors Q3 and Q4 can be replaced by a PNP transistor. The transistors Q5 and Q6 can be replaced by another PNP transistor.

It is believed that the present embodiments and their advantages will be understood from the foregoing description, and it will be apparent that various changes may be made thereto without departing from the spirit and scope of the invention or sacrificing all of its material advantages, the examples hereinbefore described merely being a preferred or exemplary embodiments.

We claim:

1. A voltage providing circuit for an electronic component, the voltage providing circuit comprising:
    a power supply circuit adapted for providing a voltage to the electronic component; and
    a first transistor, a first control signal being input to a collector of the first transistor, a second control signal being input to a base of the first transistor, an emitter of the first transistor grounded, the collector of the first transistor connected to the power supply circuit, and the second control signal and the first control signal jointly controlling the power supply circuit to be turned on or turned off,
    wherein the voltage providing circuit further comprises a second transistor and a third transistor, the second transistor and the third transistor are NPN transistors, the second control signal is input to a base of the second transistor, a collector of the second transistor is connected to a base of the third transistor, a collector of the third transistor is connected to the base of the first transistor, the second voltage is input to the collectors of the second transistor and the third transistor, and when the second control signal is at a high level, a voltage of the base of the first transistor is at a high level,
    wherein the voltage providing circuit further comprises a fourth transistor and a fifth transistor, the fourth transistor and the fifth transistor are NPN transistors, a third control signal is input to a base of the fourth transistor, a collector of the fourth transistor is connected to a base of the fifth transistor, a collector of the fifth transistor is connected to the base of the third transistor, the second voltage is input to the collectors of the fourth transistor and the fifth transistor, and when the third control signal is at a high level, a voltage of the base of the third transistor is at a high level.

2. The voltage providing circuit as claimed in claim 1, wherein the power supply circuit comprises:
    a first metal-oxide-semiconductor field-effect transistor (MOSFET), the first control signal being input to a gate of the first MOSFET, and a source of the first MOSFET receiving a first voltage;
    a second MOSFET, a gate of the second MOSFET connected to the gate of the first MOSFET, a source of the second MOSFET grounded, and a drain of the second MOSFET coupled to a drain of the first MOSFET;
    a third MOSFET, a gate of the third MOSFET connected to the drain of the second MOSFET, a source of the second MOSFET grounded via a first resistor and a second resistor, and a drain of the third MOSFET receiving a second voltage; and
    a controlled rectifier, a cathode of the controlled rectifier connected to the drain of the second MOSFET, a reference of the controlled rectifier connected to a node between the first resistor and the second resistor, and an anode of the controlled rectifier grounded.

3. The voltage providing circuit as claimed in claim 1, wherein the first control signal, the second control signal, and the third control signal are at a high level when the computer works normally.

4. A voltage providing circuit for powering an electronic component, comprising:
    a power supply circuit electrically connectable to said electronic component for powering said electronic component;
    a first transistor, comprising:
    an emitter being grounded;
    a collector electrically connectable with said power supply circuit, the collector receiving a first control signal which is provided by a first signal source, the first control signal being provided to said power supply circuit for controllably guiding said powering of said power supply circuit;
    a base receiving a second control signal, the second control signal being provided by a second signal source, the second control signal capable of controlling initiation of said electronic component according to said powering, said first transistor capable of controllably providing said first control signal to said power supply circuit based on said second control signal,
    the voltage providing circuit further comprising a second transistor and a third transistor, wherein the second transistor and the third transistor are NPN transistors, a base of the second transistor is electronically connected to a third signal source, a collector of the second transistor is connected a base of the third transistor, a collector of the third transistor is electronically connected to the base of the first transistor, a voltage is input to the collectors of the second transistor and the third transistor, and when a high level voltage is output from the third signal source, a voltage of the base of the first transistor is at a high level,
    the voltage providing circuit further comprising a fourth transistor and a fifth transistor, the fourth transistor and the fifth transistor are NPN transistors, a base of the forth transistor is connected to the second signal source, a collector of the fourth transistor is connected a base of the fifth transistor, a collector of the fifth transistor is connected to the base of the third transistor, a power supply voltage is input to the collectors of the fourth transistor and the fifth transistor, and if a voltage output from the second signal source is a high level voltage, a voltage of the base of the third transistor is at a high level.

5. The protective circuit as claimed in claim 4, wherein the first signal source, the second signal source, and the third signal source respectively output a high level voltage when the computer works normally.

* * * * *